(12) United States Patent
Hsu et al.

(10) Patent No.: US 11,495,503 B2
(45) Date of Patent: Nov. 8, 2022

(54) STRUCTURE AND PROCESS OF INTEGRATED CIRCUIT HAVING LATCH-UP SUPPRESSION

(71) Applicant: Taiwan Semiconductor Manufacturing Co., Ltd., Hsinchu (TW)

(72) Inventors: Kuo-Hsiu Hsu, Taoyuan County (TW); Yu-Kuan Lin, Taipei (TW); Feng-Ming Chang, Hsinchu County (TW); Hsin-Wen Su, Hsinchu (TW); Lien Jung Hung, Taipei (TW); Ping-Wei Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/373,303

(22) Filed: Jul. 12, 2021

(65) Prior Publication Data

US 2021/0343601 A1    Nov. 4, 2021

Related U.S. Application Data

(63) Continuation of application No. 16/521,870, filed on Jul. 25, 2019, now Pat. No. 11,062,963.

(Continued)

(51) Int. Cl.
*H01L 21/70* (2006.01)
*H01L 21/8238* (2006.01)

(Continued)

(52) U.S. Cl.
CPC .... *H01L 21/823878* (2013.01); *G06F 30/392* (2020.01); *G11C 11/412* (2013.01);

(Continued)

(58) Field of Classification Search
CPC ....... H01L 21/823878; H01L 21/76224; H01L 21/823821; H01L 21/823828;

(Continued)

(56) References Cited

U.S. PATENT DOCUMENTS 8,093,107 B1   1/2012  Nemati et al.
8,772,109 B2   7/2014  Colinge
(Continued)

FOREIGN PATENT DOCUMENTS

CN    101026124 A    8/2007
CN    102315219 A    1/2012
(Continued)

*Primary Examiner* — Calvin Y Choi
(74) *Attorney, Agent, or Firm* — Haynes and Boone, LLP

(57) ABSTRACT

A method of forming an integrated circuit, including forming a n-type doped well (N-well) and a p-type doped well (P-well) disposed side by side on a semiconductor substrate, forming a first fin active region extruded from the N-well and a second fin active region extruded from the P-well, forming a first isolation feature inserted between and vertically extending through the N-well and the P-well, and forming a second isolation feature over the N-well and the P-well and laterally contacting the first and the second fin active regions.

20 Claims, 15 Drawing Sheets

Related U.S. Application Data

(60) Provisional application No. 62/764,877, filed on Aug. 15, 2018.

(51) Int. Cl.
| | | |
|---|---|---|
| *H01L 27/092* | (2006.01) | |
| *G11C 11/412* | (2006.01) | |
| *H01L 27/11* | (2006.01) | |
| *H01L 21/762* | (2006.01) | |
| *G06F 30/392* | (2020.01) | |

(52) U.S. Cl.
CPC ............ *H01L 21/76224* (2013.01); *H01L 21/823821* (2013.01); *H01L 21/823828* (2013.01); *H01L 27/0924* (2013.01); *H01L 27/1104* (2013.01)

(58) Field of Classification Search
CPC ........... H01L 21/823431; H01L 21/845; H01L 27/0924; H01L 27/1104; H01L 27/0886; H01L 27/10826; H01L 27/10879; H01L 27/1211; H01L 27/1116; H01L 29/41791; G06F 30/392
USPC ........................................................ 257/369
See application file for complete search history.

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2005/0087810 A1* | 4/2005 | Sadra ................ H01L 27/0207 257/E21.63 |
| 2008/0171420 A1* | 7/2008 | Yang ................ H01L 21/76227 257/E21.547 |
| 2011/0006369 A1* | 1/2011 | Sonsky ................ H01L 29/785 257/E21.411 |
| 2013/0141963 A1* | 6/2013 | Liaw .................... H01L 27/1211 257/369 |
| 2015/0179503 A1* | 6/2015 | Tsai ........................ H01L 29/36 438/433 |
| 2016/0013206 A1* | 1/2016 | Vinet ...................... H01L 21/84 257/351 |
| 2016/0247728 A1 | 8/2016 | You et al. |
| 2016/0276342 A1* | 9/2016 | Lim .................... H01L 27/0886 |
| 2016/0351565 A1* | 12/2016 | Sung ................ H01L 21/76229 |
| 2017/0062613 A1* | 3/2017 | Sung ................ H01L 21/76224 |
| 2018/0122943 A1* | 5/2018 | Han .................... H01L 29/7841 |
| 2020/0058564 A1 | 2/2020 | Hsu et al. |

FOREIGN PATENT DOCUMENTS

| | | |
|---|---|---|
| CN | 103151071 A | 6/2013 |
| CN | 103715261 A | 4/2014 |
| KR | 20160102787 A | 8/2016 |
| TW | 594912 | 6/2004 |

\* cited by examiner

STRUCTURE AND PROCESS OF INTEGRATED CIRCUIT HAVING LATCH-UP SUPPRESSION

PRIORITY DATA

This is a continuation application of U.S. patent application Ser. No. 16/521,870, filed on Jul. 25, 2019, which further claims priority to U.S. Provisional Patent Application Ser. No. 62/764,877 filed on Aug. 15, 2018, the entire disclosure of which is incorporated herein by reference.

BACKGROUND

In integrated circuit, an embedded static random-access memory (SRAM) device has become a popular storage unit of high speed communication, image processing and system-on-chip (SOC) products. As a SRAM device of two cross-coupled inverters is formed with field-effect transistors, electrical couplings among various transistors and other features of the SRAM device introduce parasitic bipolar junction transistors. When those parasitic bipolar junction transistors are turned on undesirably, a latch-up occurs, which is accompanying with current surge. This leads to high power consumption, device performance degradation and even data loss. For other circuits, such as logic circuits, the latch-up effect is also concern with same issues. Therefore, there is a need for a structure and method for an integrated circuit having latch-up suppression with enhanced circuit performance and reliability.

BRIEF DESCRIPTION OF THE DRAWINGS

Aspects of the present disclosure are best understood from the following detailed descriptions when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
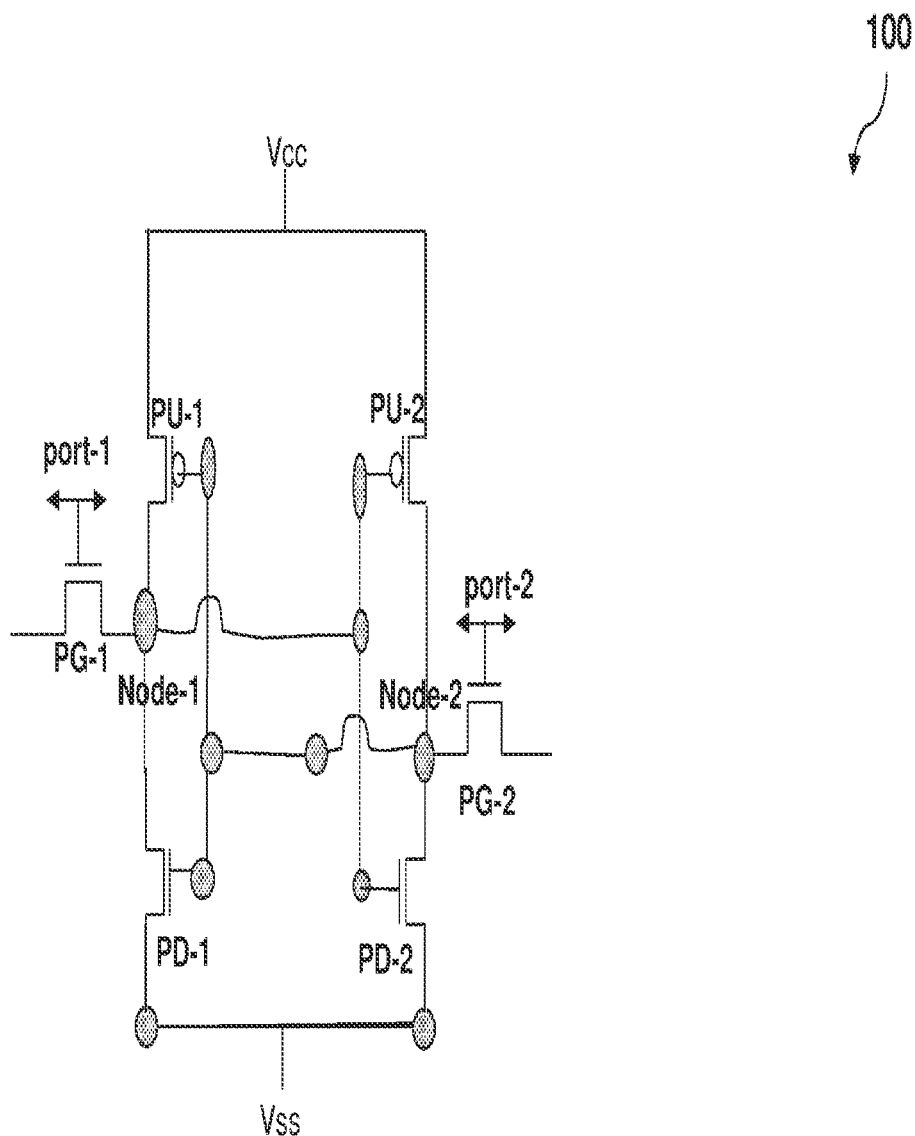
FIG. 1 is a schematic view of a static random-access memory (SRAM) device constructed according to various aspects of the present disclosure in some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact and may also include embodiments in which additional features may be formed interposing the first and second features, such that the first and second features may not be in direct contact.

The present disclosure provides an integrated circuit structure with latch-up suppression and the method making the same. In various embodiments, the method includes modifying the circuit layout, the fabrication, or a combination thereof. The SRAM device is provided below as one embodiment for the corresponding structure and method with latch-up suppression in detailed description. However, the disclosure is not limited to SRAM devices and is applicable to other circuits having latch-up issues. For example, disclosure is applicable to any integrated circuit, such as a logic circuit having an inverter, therefore having the latch-up effect.

FIG. 1 is a schematic view of a SRAM device 100, in portion, constructed according to various aspects of the present disclosure in accordance with some embodiments. The SRAM device 100 is formed with field-effect transistors (FETs), such as fin field-effect transistors (FinFETs) or planar field-effect transistors. The SRAM device 100 includes first and second inverters that are cross-coupled. The first inverter includes a first pull-up device formed with a p-type field-effect transistor (pFET, referred to as PU-1) and a first pull-down device formed with an n-type field-effect transistor (nFET, referred to as PD-1). The second inverter includes a second pull-up device formed with a pFET (referred to as PU-2) and a second pull-down device formed with a nFET (referred to as PD-2). Specifically, the drains of PU-1 and PD-1 are electrically connected to a first node ("Node-1"). The drains of PU-2 and PD-2 are electrically connected to a second node ("Node-2"). The gates of PU-1 and PD-1 are electrically connected and coupled to the second node. The gates of PU-2 and PD-2 are electrically connected and coupled to the first node. The sources of PU-1 and PU-2 are electrically connected to the high-power line ("Vcc"). The sources of PD-1 and PD-2 are electrically connected to a complementary power line ("Vss"). The SRAM device 100 further includes a first pass gate ("PG-1") connected to the first node as a portion of a first port ("port-1") and a second pass gate ("PG-1") connected to the second node as a portion of a second port ("port-2") for reading and writing. The SRAM device 100 may include additional devices such as additional pull-down devices, pull-up devices, and pass-gate devices.

Figure 2:
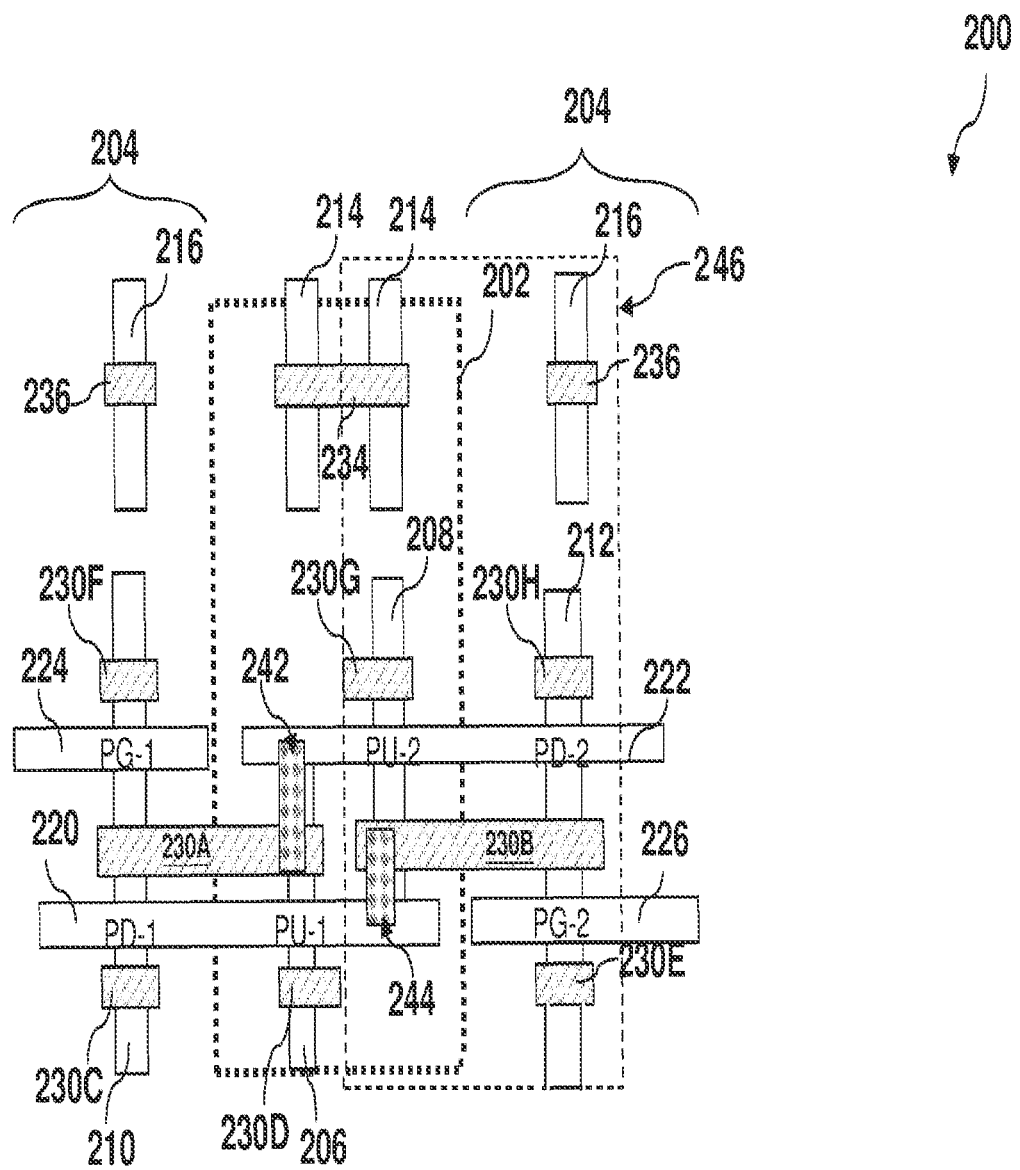
FIG. 2 is a top view of the SRAM device of FIG. 1 constructed according to various aspects of the present disclosure in some embodiments.

FIG. 2 is a top view of the SRAM device 200 constructed in accordance with some embodiments. The SRAM device 200 is one embodiment of the SRAM device 100. The SRAM device 200 includes multiple field-effect transistors. The SRAM device 200 is formed on a semiconductor substrate having an n-type well (N-well or "NW") 202 for pFETs to be formed thereon and a p-type well (P-well or "PW") 204 for nFETs to be formed thereon. In some embodiments, the P-well 204 is a continuous p-type doped region surrounding the N-well 202. In some other embodiments, the P-well 204 includes two segments on two opposite sides of the N-well 202. The SRAM device 200 includes various active regions, such as fin active regions, formed on the semiconductor substrate in the N-well and P-well, respectively. In the present embodiment, the SRAM device 200 includes fin active regions 206 and 208 disposed within the N-well 202 and fin active regions 210 and 212 disposed within the P-well 204. The SRAM device 200 further includes active regions 214 and active regions 216 formed on the N-well 202 and the P-well 204, respectively, to provide electrical bias to the N-well 202 and the p-well 204.

The SRAM device 200 includes various gates formed on active regions and configured with the active regions to nFETs and pFETs. In this example, the SRAM device 200 includes gate stacks 220, 222, 224 and 226. Especially, the gate stack 220 is aligned with the gate 226, and the gate stack 222 is aligned with the gate stack 224. The gate stack 220 is configured as a continuous gate for both PD-1 and PU-1; the gate stack 222 is configured as a continuous gate for both PD-2 and PU-2; the gate stack 224 is landing on the active region 210 as a first pass gate ("PG-1"); and the gate 226 is landing on the active region 212 as a second pass gate ("PG-2"). A pass gate is a structure for data reading and writing in a memory device and should not be confused with the term gate, which is a component of a field-effect transistor.

Various contacts are further formed and configured to couple sources, drains and gates to form the SRAM device 200 that can retain, write and read data as a memory cell. In this example, the SRAM device 200 includes various contacts 230A-230H, 234 and 236. Specifically, the contact 234 connects to the active regions 214 as an N-well pick-up so that an electrical bias can be applied to the N-well 202. The contact 236 connects to the active regions 216 as a P-well pick-up so that an electrical bias can be applied to the P-well 204. The SRAM device 200 may further include butt contacts 242 and 244 contacting a gate to a drain, as illustrated in FIG. 2.

Figure 3:
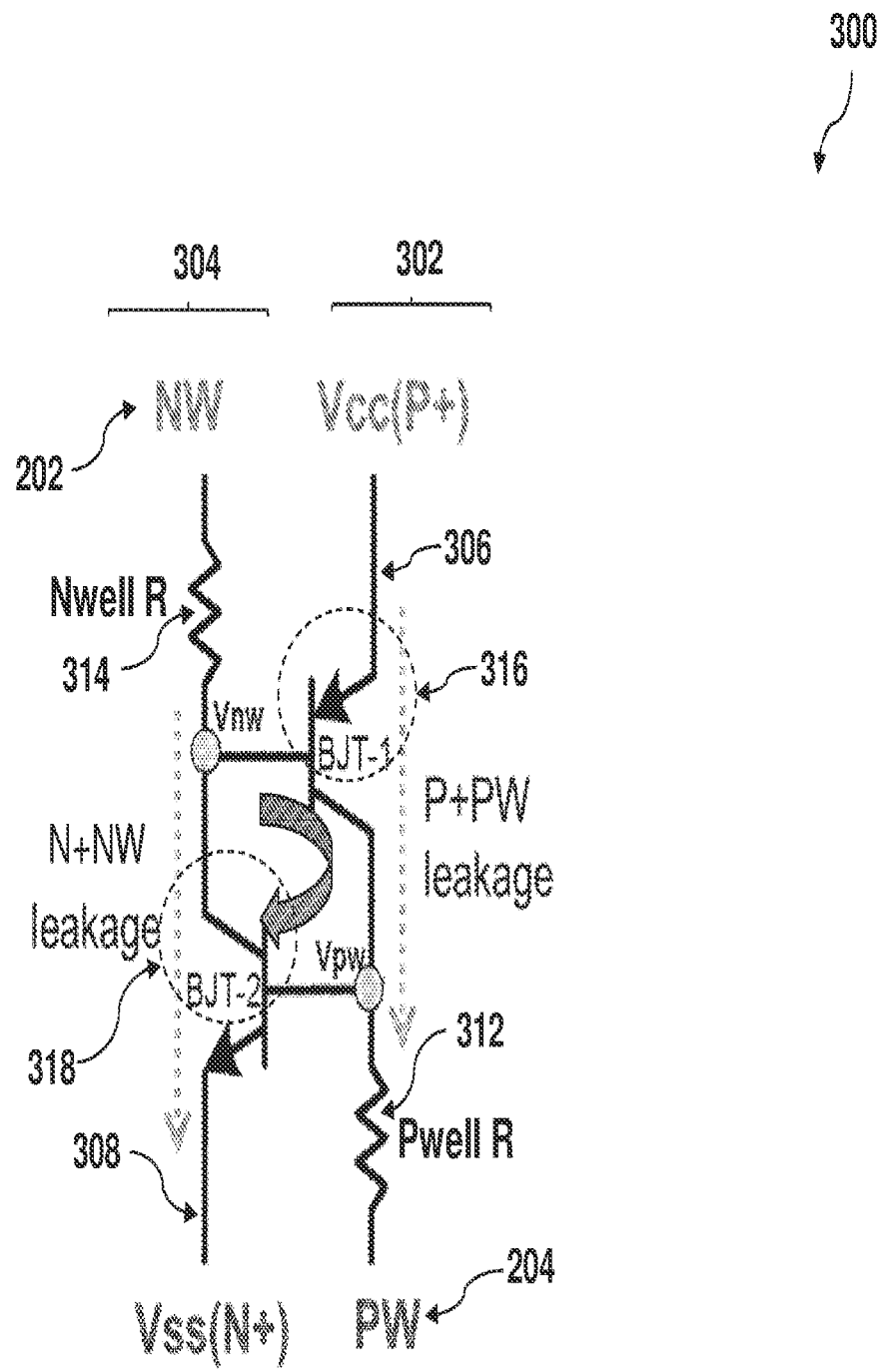
FIG. 3 is a schematic view of parasitic bipolar junction transistors in the SRAM device of FIG. 2 constructed according to various aspects of the present disclosure in some embodiments.

FIG. 3 is a schematic view of a parasite bipolar junction transistor (PBJT) structure 300 of the SRAM device 200, constructed in accordance with some embodiments. The PBJT structure 300 is formed in a portion 246 of the SRAM device 200 enclosed in a dashed line in FIG. 2. The PBJT structure 300 includes a first BJT ("BJT-1") 302 and a second BJT ("BJT-2") 304. The first BJT 302 includes a source (P+ doped) 306 of the PU-2 biased to the high-voltage power line Vcc; the N-well 202; and the P-well 204 connected to the P-well pick-up 236, forming a PNP bipolar transistor 302. The second BJT 304 includes a source (N+ doped) 308 of the PD-1 biased to the low-voltage power line Vss; the P-well 204; and the N-well 202 connected to the N-well pick-up 234, forming a NPN bipolar transistor 304. When both the first and second BJTs 302 and 304 are undesirably turned on, a latch-up occurs with current surge. The current surge may cause power consumption, performance degradation and even data loss from the SRAM device 200. Usually, the P-well 204 and the P-well pick-up 236 includes a certain resistance ("Pwell R") 312; and the N-well 202 and the N-well pick-up 234 also include a certain resistance ("Nwell R") 314. The parasitic BJTs are further explained below.

Take an PN junction 316 as an example. The PN junction 316 includes the source 306 of the PU-2 as a P+ doped region and the N-well 202 as a N-type doped region. The first BJT 302 can be turned on only after the PN junction 316 is turned on. In a normal operation condition, both the source 306 and the N-well 202 are biased to the high-power line Vcc. However, there is a current leakage through the second BJT 304 from the source 308 to the N-well 202 as illustrated by the dashed arrow line ("N+NW leakage"). The current leakage leads to a voltage drop ("Vnw") on the resistance 314 of the N-well 202, which further causes a voltage difference between the source 306 and the N-well 202. When this voltage difference is greater than the corresponding threshold voltage, the PN junction 316 turns on.

Similarly, another PN junction 318 includes the P-well 204 as a p-type doped region and the source 308 of the PD-1 as a N+ doped region. The second BJT 304 can be turned on only after the PN junction 318 is turned on. In a normal operation condition, both the source 308 and the P-well 204 are biased to the low-power line Vss. However, there is a leakage through the first BJT 302 from the source 306 to the P-well 204 to as illustrated by the dashed arrow line ("P+PW leakage"). This current leakage leads to a voltage drop ("Vpw") on the resistance 312 of the P-well 204, which further causes a voltage difference between the source 308 and the P-well 204. When this voltage difference is greater than the corresponding threshold voltage, the PN junction 318 turns on.

When both the first BJT 302 and the second BJT 304 are turned on, a latch-up event occurs with a current surge. With the supports of the experiments and above analysis, the two sources of the latch-up effect are identified to be: well resistance and current leakage. The disclosure provides methods and corresponding isolation structures to reduce the current leakage. Particularly, the present disclosure provides methods and structures with dielectric isolation to reduce the leakage between the N-well 202 and the P-well 204, thereby eliminating the latch-up effect.

Figure 4:
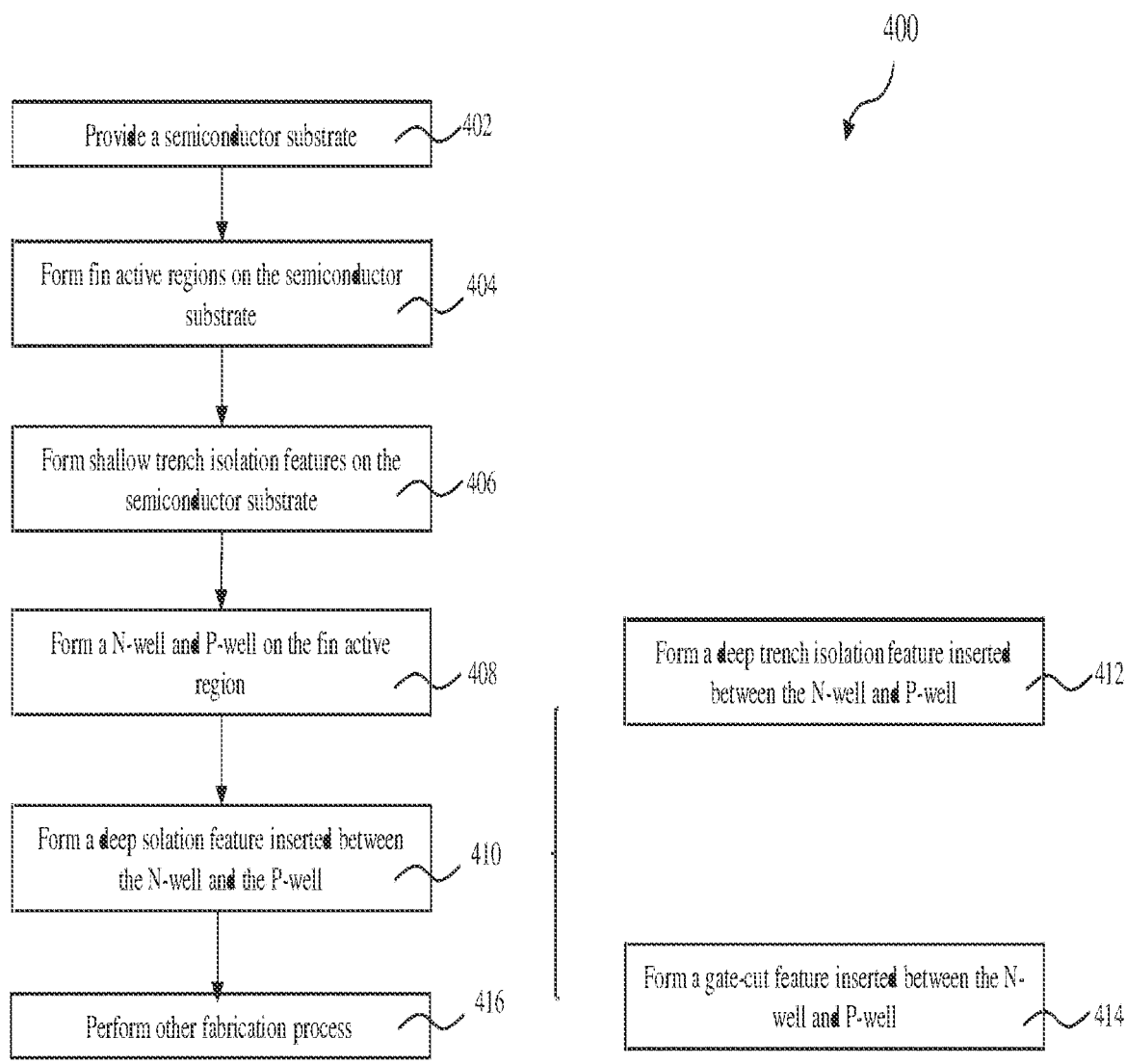
FIG. 4 is a flowchart of a method making a semiconductor structure constructed according to various aspects of the present disclosure in some embodiments.
Figure 5A:
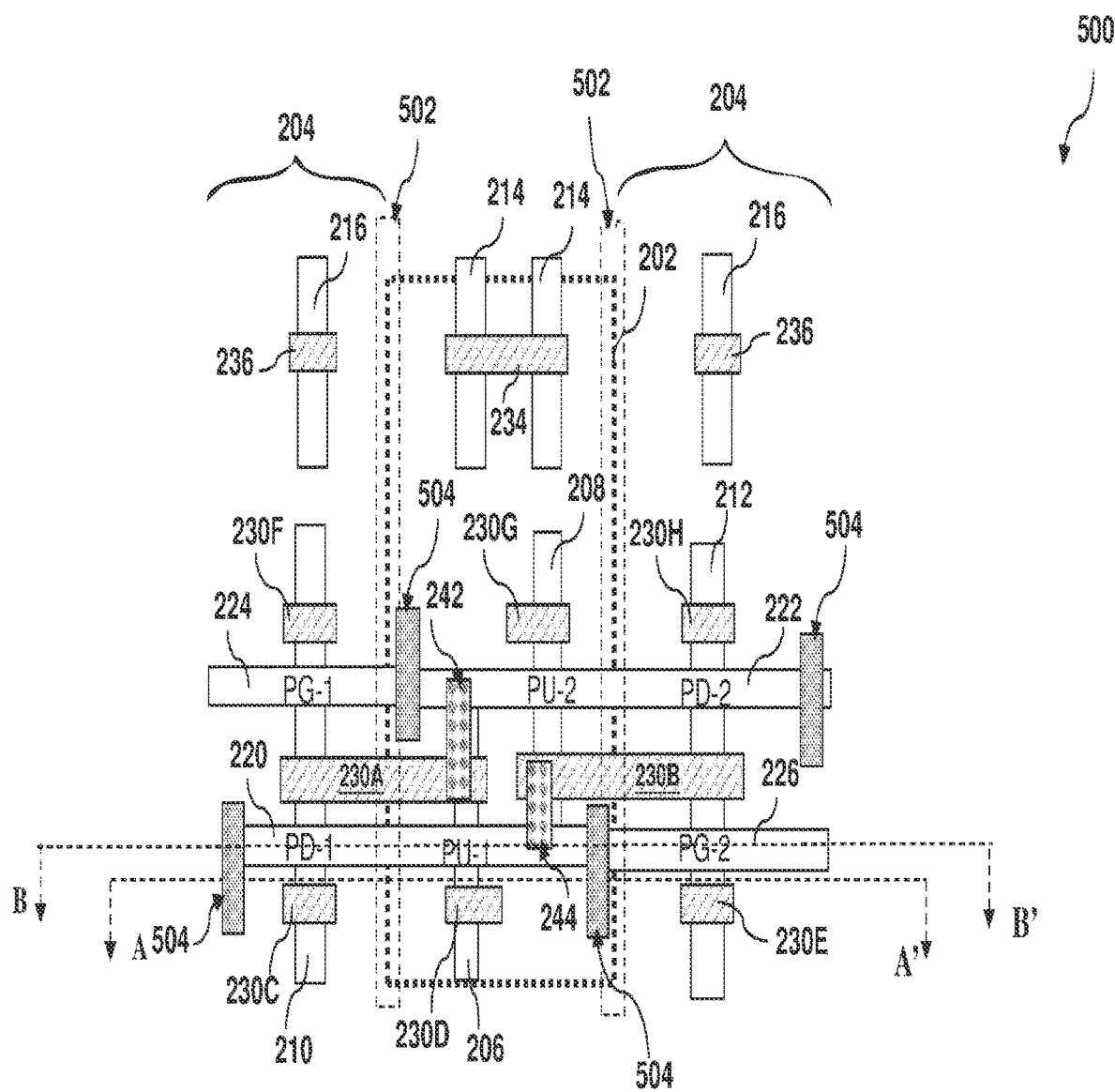
FIG. 5A is a top view of a semiconductor structure made by the method of FIG. 4 constructed according to various aspects of the present disclosure in some embodiments.
Figure 5B:
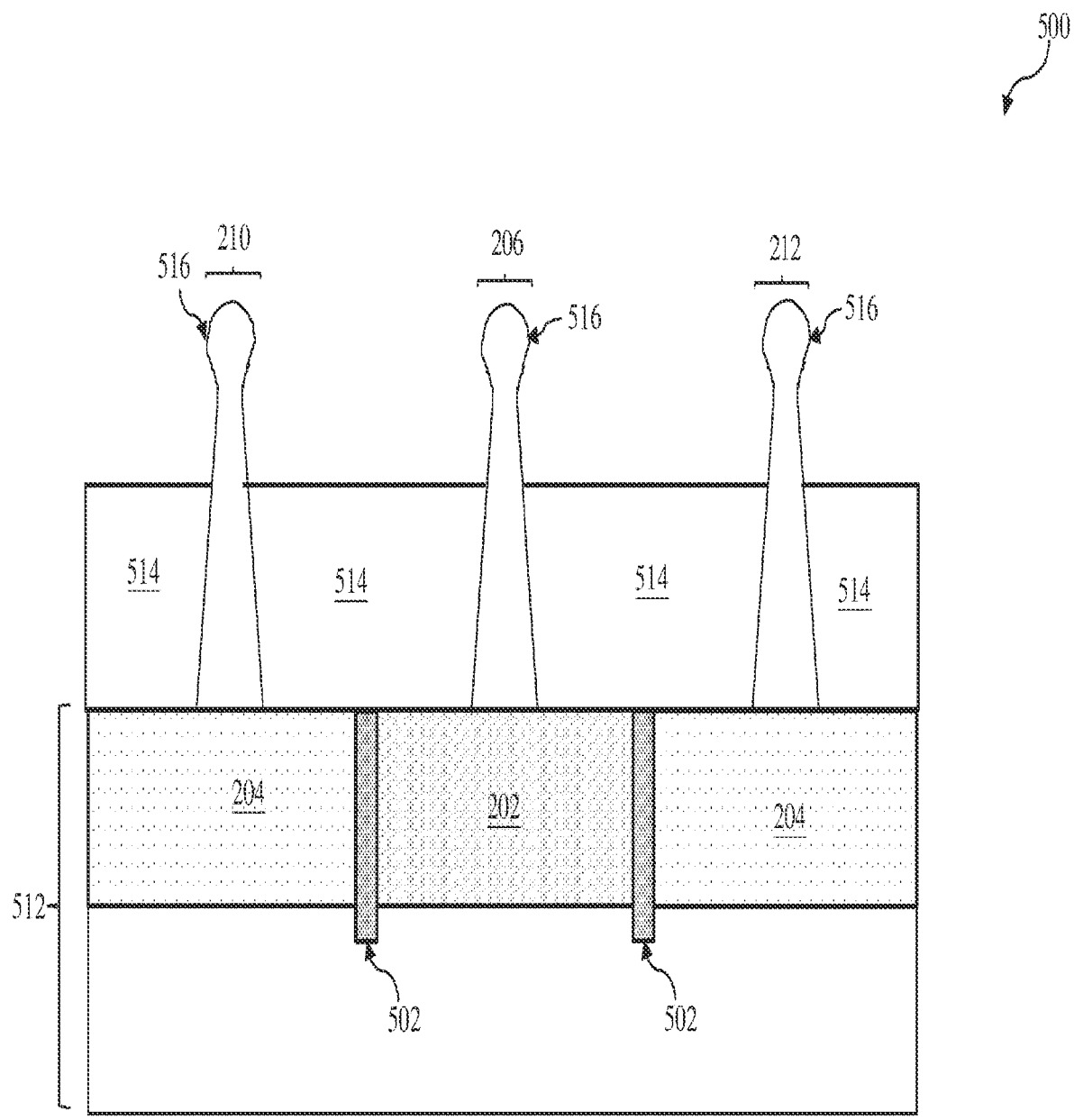
FIG. 5B is a sectional view of the semiconductor structure, in portion, of FIG. 5A along the dashed line AA' constructed according to various aspects of the present disclosure in some embodiments.
Figure 5C:
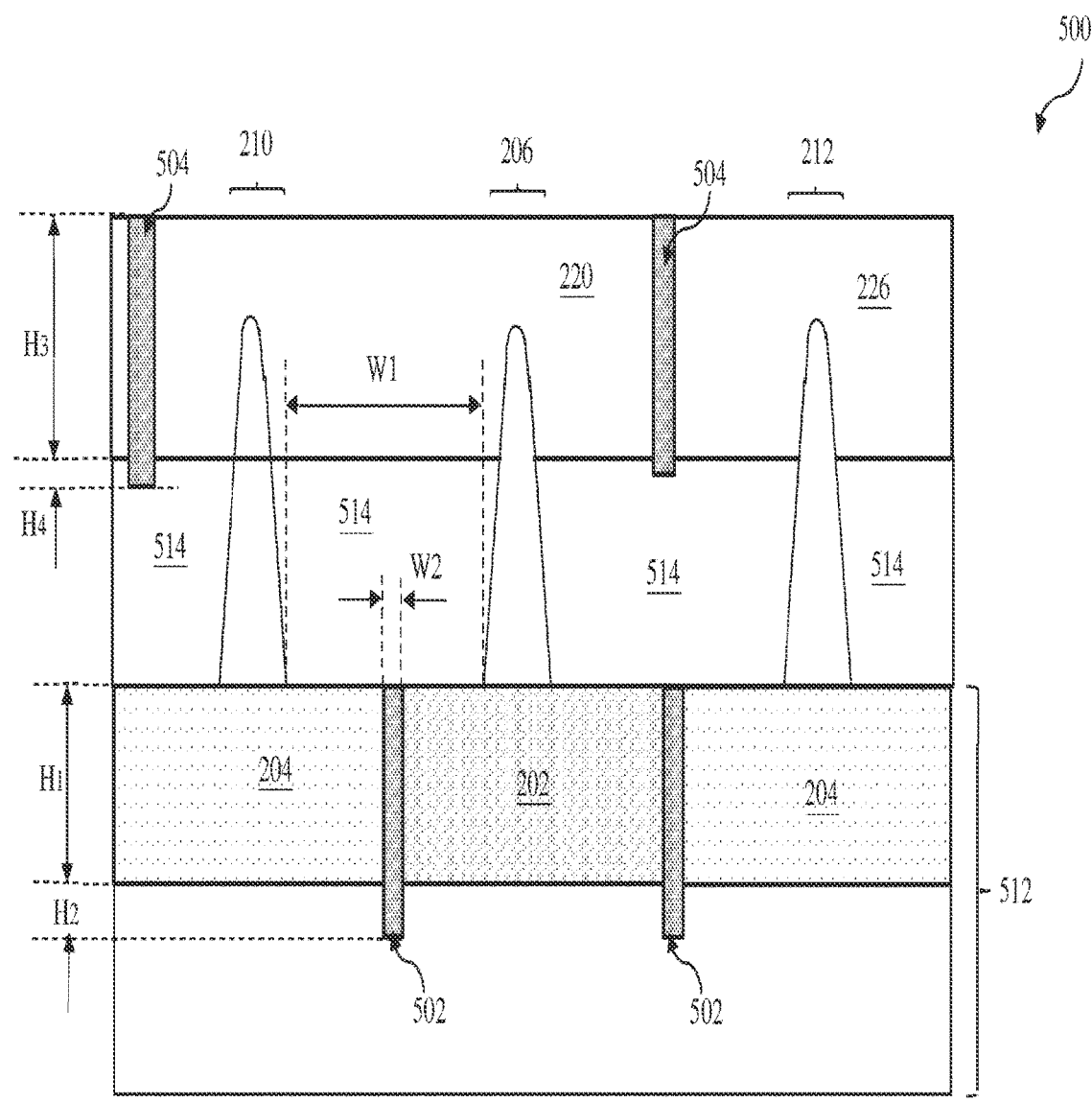
FIG. 5C is a sectional view of the semiconductor structure, in portion, of FIG. 5A along the dashed line BB' constructed according to various aspects of the present disclosure in some embodiments.
Figure 7:
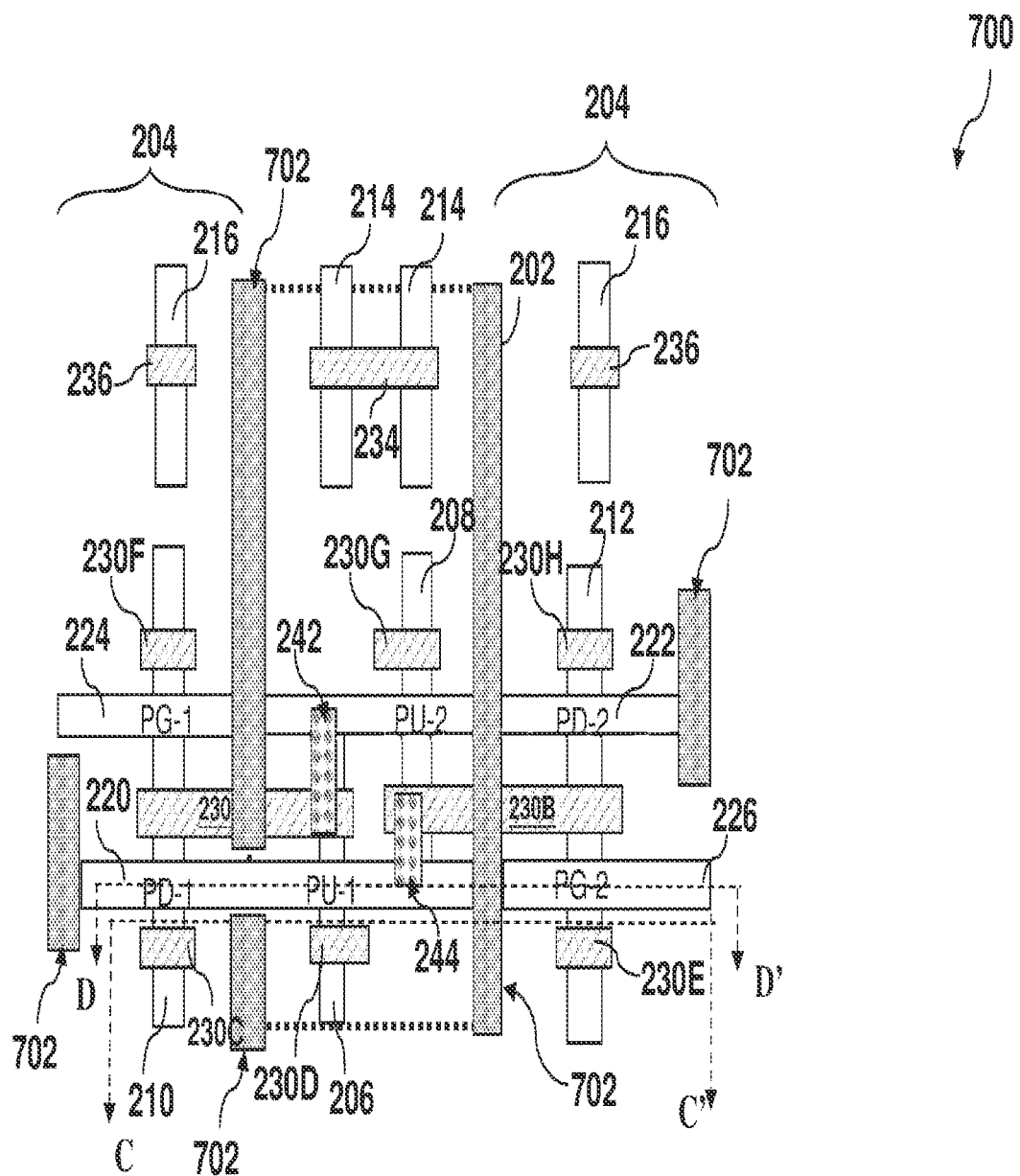
FIG. 7 is a top view of a semiconductor structure made by the method of FIG. 4, constructed according to various aspects of the present disclosure in some embodiments.
Figure 8A:
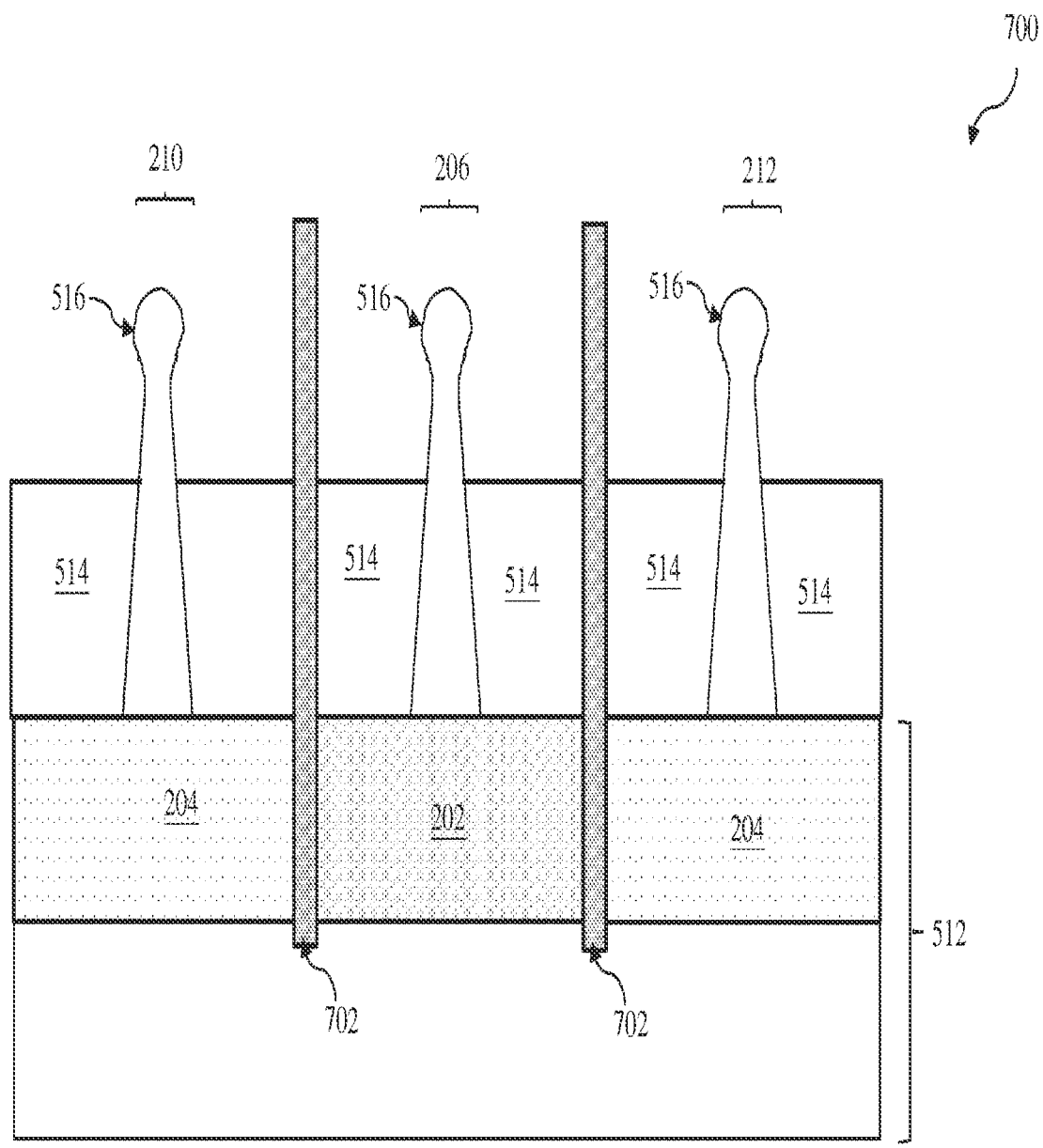
FIG. 8A is a sectional view of the semiconductor structure, in portion, of FIG. 7 along the dashed line CC', constructed according to various aspects of the present disclosure in some embodiments.
Figure 8B:
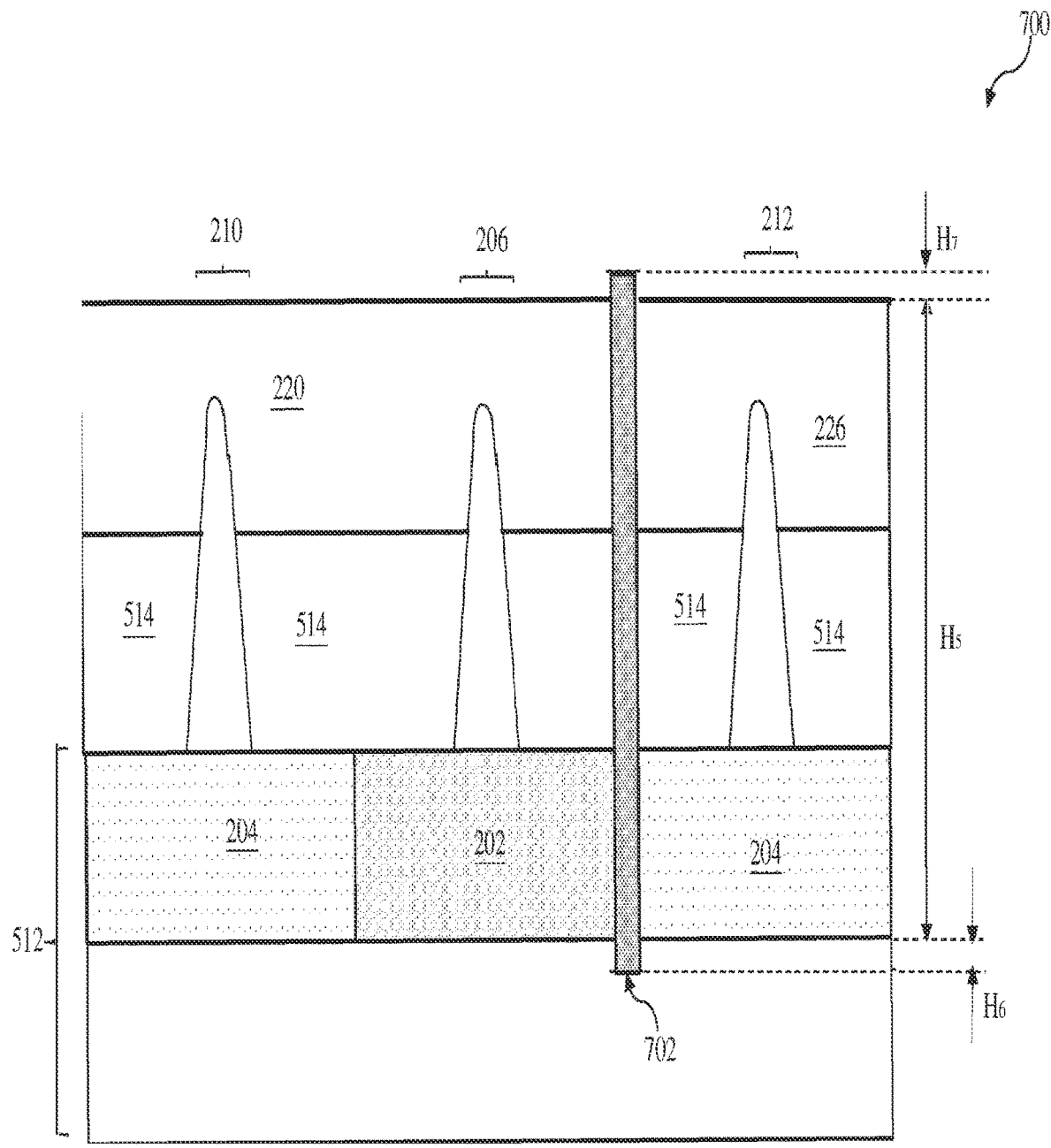
FIG. 8B is a sectional view of the semiconductor structure, in portion, of FIG. 7 along the dashed line DD', constructed according to various aspects of the present disclosure in some embodiments.

FIG. 4 is a flowchart of a method 400 to form a semiconductor structure having one or more SRAM devices or other circuit having one or more inverter. FIG. 5A is a top view of a semiconductor structure 500; FIG. 5B is a sectional view of the semiconductor structure 500 along the dashed line AA', in portion; and FIG. 5C is a sectional view of the semiconductor structure 500 along the dashed line BB', in portion, constructed in accordance with some embodiments. FIG. 7 is a top view of a semiconductor structure 700; FIG. 8A is a sectional view of the semiconductor structure 700 along the dashed line CC', in portion; and FIG. 8B is a sectional view of the semiconductor structure 700 along the dashed line DD', constructed in accordance with some other embodiments. The method 400 is described in detailed with the semiconductor structures 500 and 700 as different embodiments.

The method 400 includes a block 402 by providing a semiconductor substrate 512 such as silicon wafer or any other suitable semiconductor substrate. The method 400 proceeds to operation 404 by forming fin active regions (such as fin active regions 206, 210 and 212 illustrated in FIG. 5B) on the semiconductor substrate 512. In operation 404, the formation of fin active regions includes patterning the semiconductor substrate 512 by lithography process and etching to pattern the semiconductor substrate 512 to from various trenches therein and fin active regions surrounded by the trenches. The method 400 also includes an operation 406 to form shallow trench isolation (STI) features 514. The STI features 514 includes one or more dielectric material filled in the trenches to provide isolation functions. In some embodiments, the formation of the STI features 514 includes deposition to fill in the trench with one or more dielectric materials (such as silicon oxide) by a suitable deposition technique (such as chemical vapor deposition-CVD, high-density plasma CVD-HDPCVD, or high aspect ratio process-HARP); then polishing such as chemical mechanical polishing (CMP); and etching to recess such that the fin active regions are extruded above the STI features 514. In some other embodiments, the operations 404 and 406 to form the fin active regions and the STI features may include patterning the semiconductor substrate by lithography process/etching to form trenches; filling the trenches with one or more dielectric material; CMP; and epitaxial growth with one or more semiconductor material (such as silicon and/or silicon germanium) to form fin active regions and STI features.

The method 400 also includes an operation 408 to form various doped wells, such as an n-type doped well (N-well) 202 and a p-typed doped well (P-well) 204 in the semiconductor substrate 512 under the STI features 514. In some embodiments, the N-well 202 includes doped species such as phosphorous and the P-well 204 includes doped species such as boron. The formation of the N-well 202 and the P-well 204 includes patterning by lithography process and etching to form hard mask and ion implantation to introduce proper doping species into semiconductor substrate 512. A hard mask may include silicon oxide, silicon nitride or other suitable material. In one embodiment, a first hard mask is formed on the semiconductor structure 500 by deposition, lithography process and etching to cover the region for the P-well 204 and expose the region for the N-well 202; an ion implantation process is applied to introduce n-type dopant to form the N-well 202; the first hard mask is removed by etching; then, a second hard mask is formed on the semiconductor structure 500 by deposition, lithography process and etching to cover the region for the N-well 202 and expose the region for the P-well 204; another ion implantation process is applied to introduce p-type dopant to form the N-well 202; and the second hard mask is removed by etching.

The method 400 also includes an operation 410 to form a deep isolation features (502 in the semiconductor structure 500 or 702 the semiconductor structure 700) that is aligned with the common edges of the N-well 202 and the P-well 204 and is inserted between the N-well 202 and the P-well 204 to effectively isolate the corresponding adjacent N-well 202 and P-well 204. The deep isolation feature is at least partially embedded in the semiconductor substrate along the common edge of the N-well 202 and the P-well 204. The bottom surface of the deep isolation feature is below the top surface of the N-well 202 and the P-well 204. Furthermore, the deep isolation feature is vertically extended at least from the top surface to below the bottom surface of the N-well 202 and the P-well 204. Compared with the STI features 514, the deep isolation features at least include portions that are disposed below the bottom surface of the STI features 514 and embedded in the semiconductor substrate 512. Especially, a STI feature 514 has a first width $W_1$ and the deep isolation feature has a second width $W_2$ less than the first width $W_1$, as illustrated in FIG. 5C. In the present embodiment, the STI feature 514 laterally spans from a sidewall of one fin active region (such as 210) to a sidewall of another fin active region (such as 206). The deep isolation feature is distanced away from the fin active regions.

In some embodiments (such as one associated with the semiconductor structure 500), the operation 410 includes a process 412 to form a deep trench isolation (DTI) feature 502 as a deep isolation feature that is inserted between the adjacent N-well 202 and P-well 204, as illustrated in FIGS. 5A, 5B and 5C. In some embodiments, the DTI features 502 are formed by a procedure similar to the procedure that forms the STI features 514. For example, the formation of the DTI features 502 includes patterning to form deep trenches aligned to the common edge of adjacent N-well and P-well; and deposition to fill in the trench with one or more dielectric materials. In some embodiments, the STI features 514 and the DTI features 502 are collectively formed. In this case, during the operations 404 and 406 to form trenches and fin active regions, two patterning processes (each including lithography process and etch) are applied to form shallow trenches and deep trenches, respectively, in either sequence (deep-trench first and shallow-trench afterward or vice versa); one or more dielectric material is filled into both the deep trenches and shallow trenches by deposition to form the STI features 514 and DTI features 502; and a CMP process to planarize the top surface. An etching process may be applied to recess the dielectric material of the STI features 514 and the DTI features 502, thereby forming the fin active regions. In some examples, the DTI features 502 are vertically extended below the bottom surfaces of the N-well 202 and P-well 204 to ensure the effective isolation function. In FIG. 5B, $H_1$ represents a height of the N-well 202 and P-well 204 while $H_2$ represents a height of the portion of a DTI feature 502 extended beyond the N-well 202 and P-well 204. In the present embodiment, the DTI feature 502 vertically fully extended through the N-well 202 and P-well 204, and further extends an additional height $H_2$ below the bottom surface of the N-well 202 and P-well 204. In some embodiments, a ratio of $H_1$ and $H_2$ as $H_2/H_1$ is greater than 0.2 or ranging between 0.2 and 0.5.

In furtherance of the embodiment associated with the semiconductor structure 500, the method 400 further include a process to form one or more gate-cut features 504 to cut the gate stacks. The gate-cut features 504 are dielectric features and formed to cut a long gate stack into two or more gate stacks (such as gate stacks 220 and 226 in FIG. 5C) by a double (or multiple) patterning procedure. The formation of the gate-cut features 504 is similar to the formation of the gate-cut features 702, which will be described in detail. The gate-cut features 504 fully vertically extend through the gate stacks and may further extend beyond (to effectively cut the gate stack), such as intruding into the STI features 514. In some embodiments, a ratio of $H_3$ and $H_4$ as $H_4/H_3$ is greater than 0.2 or ranging between 0.2 and 0.5.

In alternative embodiments associated with the semiconductor structure 700, the deep isolation features are formed by the process 414. In these embodiments, the operation 410 includes a process 414 to form a gate-cut feature 702 as a deep isolation feature that is inserted between the adjacent N-well and P-well. Accordingly, such isolation features are gate-cut features 702 as illustrated in FIGS. 7 and 8. A gate-cut feature 702 is modified to serve for the isolation purpose. For various FETs, the corresponding gates are formed by double patterning with a first patterning process to form long gates and a second patterning process to form dielectric features to cut the long gates with improved gate ends. Those dielectric features are referred to as gate-cut features. Usually, these gate-cut features are shallow and are not aligned with the interface of the N-well and the P-well, such as those 504 illustrated in FIGS. 5A–5C. The process 414 includes modifying the design layout of the integrated circuit such that a gate-cut feature is shifted to be aligned with the interface of the N-well 202 and the P-well 204. The process 414 also includes forming the gate-cut feature deeper into the interface of the N-well 202 and the P-well 204 to effectively isolate each other, as illustrated in FIG. 8. The gate-cut features 702 include one or more dielectric material, such as silicon oxide, silicon nitride, silicon oxynitride, low-k dielectric material, other suitable dielectric material or a combination thereof. The formation of the gate-cut features 702 includes depositing a hard mask and patterning the hard mask (by lithography process and etching) to form a patterned hard mask with an opening aligned with the interface between the adjacent N-well 202 and the P-well 204; etching the gates using the patterned hard mask as an etch mask and further etching into the semiconductor substrate to form a trench cut into the interface of the N-well and P-well; and filling a dielectric material into the trench to form a modified gate-cut feature 702 to isolation the adjacent N-well and P-well. In this case, the gate-cut feature 702 has a bottom surface below the top surface and even below the bottom surface of the N-well 202 and the P-well 204. In furtherance of the embodiment, the gate-cut feature 702 vertically extends through the gate stacks (220 and 226 in FIG. 8B), the STI features 514 and the N-well 202 and the P-well 204. The gate-cut feature 702 vertically punches through the common edge of the N-well 202 and the P-well 204 and extrudes above the STI features 514 to cut the gate stacks. The gate-cut features 704 fully vertically extend through the gate stacks and may further extend beyond (to effectively cut the gate stack), such as intruding into the overlying interlayer dielectric (ILD) layer. In some embodiments as illustrated in FIG. 8B, the full height of the gate-cut feature 702 is $H_5+H_6+H_7$. In the formula, $H_5$ represents the sum of the well height, the STI height and the gate height; $H_6$ represents a height of a portion of the gate-cut feature 702 above the gate stack; and $H_7$ represents a height of a portion of the gate-cut feature 702 below the N-well 202 and the P-well 204. In some example, a ratio of $H_6/H_5$ is greater than 0.05 or ranging between 0.05 and 0.2. In some example, a ratio of $H_7/H_5$ is greater than 0.05 or ranging between 0.05 and 0.1.

Figure 6:
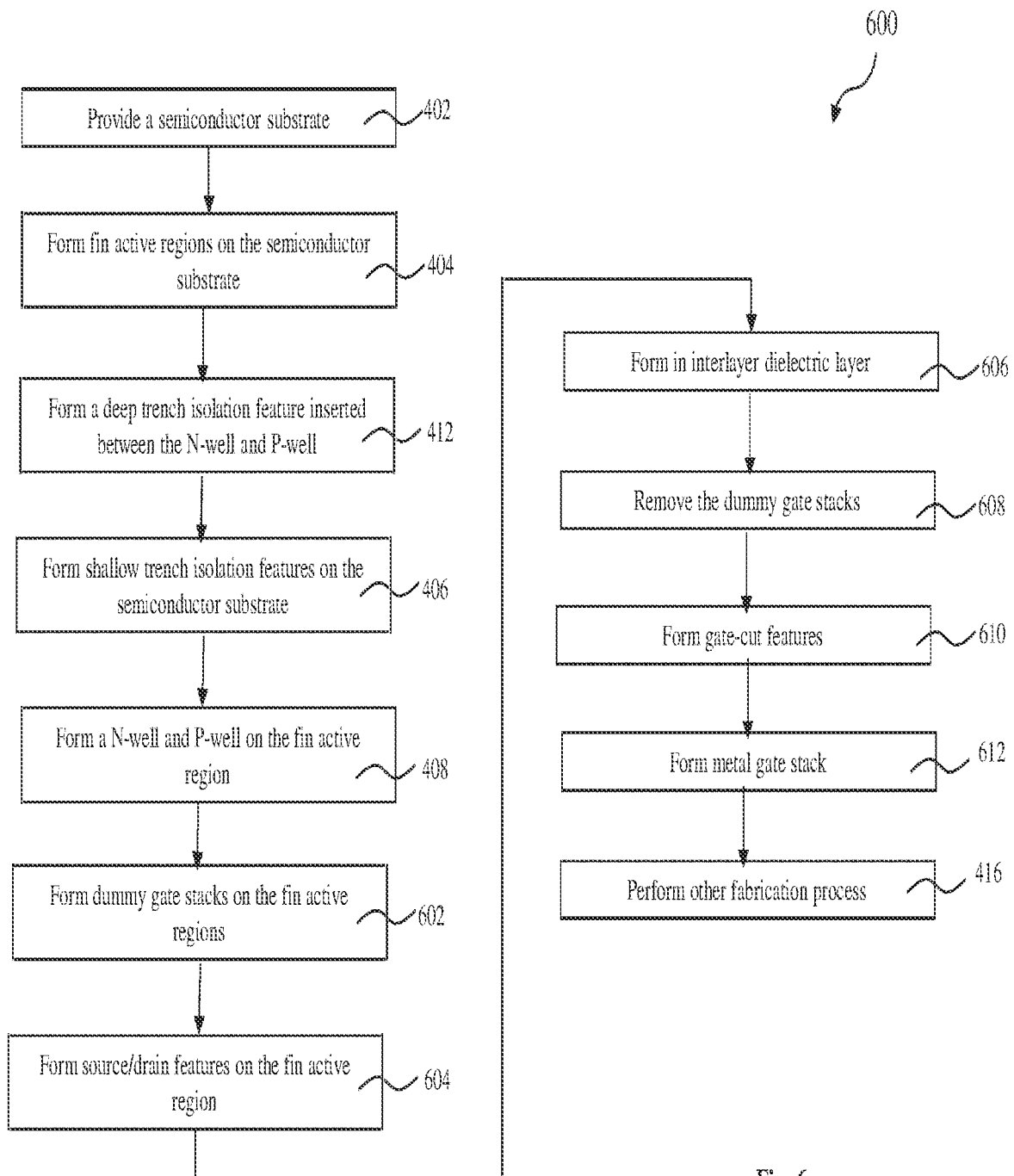
FIG. 6 is a flowchart of a method making the semiconductor structure of FIGS. 5A and 5B in accordance with some embodiments.

The method 400 may also include other operations 416 before, during or after the above operations. For example, the method 400 includes forming sources and drains (also referred to as source and drain features) 516 as illustrated in FIGS. 6 and 8. The source and drain features 516 are formed by etching to recess source/drain regions; and epitaxially growing the source and drain features 516 in the recessed source/drain regions.

A gate stack (such as 220) includes a gate dielectric layer of a dielectric material and a gate electrode of a conductive material on the gate dielectric layer. In some embodiments, the gate dielectric layer includes silicon oxide and the gate electrode includes doped polysilicon. In alternative embodiments, the gate dielectric layer includes a high-k dielectric material and the gate electrode includes a metal or a metal alloy, therefore being referred to as a high-k metal gate (HKMG). The method 400 also includes a procedure to form the gate stacks (such as 220 and 226) by a gate replacement procedure. In the case In the gate replacement, a dummy gate is formed by deposition and patterning, then the sources and drains are formed by etching to recess source and drain regions, and epitaxially growing a semiconductor material; an ILD layer is deposited and polished (such as CMP); the dummy gate is removed to form a gate trench; and thereafter the gate dielectric material(s) and the gate electrode material(s) are filled in the gate trench, such as by deposition and CMP. Such formed gate stack is further described with reference to FIGS. 11A and 11B in accordance with various embodiments.

Figure 11A:
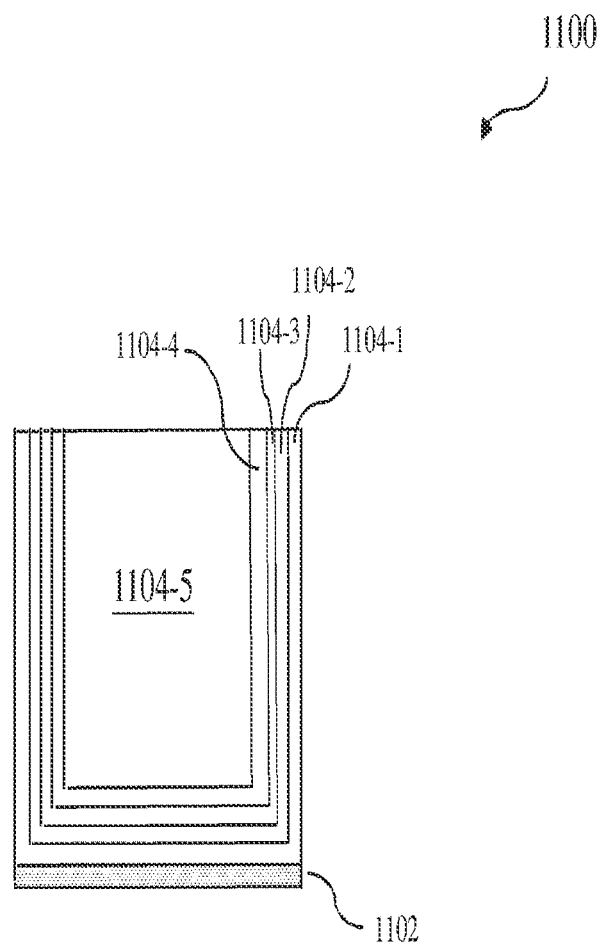
FIGS. 11A and 11B are sectional views of a gate stack of the semiconductor structure constructed according to various embodiments.

FIG. 11A is a sectional view of a gate stack 1100 formed by a gate replacement procedure, also referred to as a gate-last process. In the gate-last process, only the gate electrode is replaced at the late stage while the gate dielectric layer is deposited during the formation of the dummy gate and remains after the gate-replacement process. The gate stack 1100 includes a gate dielectric layer 1102 and a gate electrode 1104. In various examples, the gate dielectric layer 1102 includes a high-k dielectric material and the gate electrode 1104 includes metal or metal alloy. In some examples, the gate dielectric layer 1102 and the gate electrode 1104 each may include a number of sub-layers. The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The gate dielectric layer 1102 may additionally include an interfacial layer interposed between the high-k dielectric material layer and the channel. The interfacial layer may include silicon oxide, silicon nitride, silicon oxynitride, and/or other suitable material. The interfacial layer is deposited by a suitable method, such as atomic layer deposition (ALD), CVD, ozone oxidation, etc. The high-k dielectric layer is deposited on the interfacial layer by a suitable technique, such as ALD, CVD, metal-organic CVD (MOCVD), physical vapor deposition (PVD), thermal oxidation, combinations thereof, and/or other suitable techniques.

The gate electrode 1104 may include Ti, Ag, Al, TiAlN, TaC, TaCN, TaSiN, Mn, Zr, TiN, TaN, Ru, Mo, Al, WN, Cu, W, Ru, Co, or any suitable conductive materials. In some embodiments, different metal materials are used for nFET and pFET devices with respective work functions to enhance device performance. In some embodiments, the gate electrode 1104 may include multiple conductive materials, such as a capping layer 1104-1, a blocking layer 1104-2, a work function metal layer 1104-3, another blocking layer 1104-4 and a filling metal layer 1104-5, or a subset thereof. In furtherance of the embodiments, the capping layer 1104-1 includes titanium nitride, tantalum nitride, or other suitable material. The blocking layer 1104-2 includes titanium nitride, tantalum nitride, or other suitable material. The work functional metal layer 1104-3 includes a conductive layer of metal or metal alloy with proper work function such that the corresponding FET is enhanced for its device performance. The work function (WF) metal layer 1104-3 is different in composition for a pFET and a nFET, respectively referred to as an p-type WF metal and a n-type WF metal. Particularly, an n-type WF metal is a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The work function metal is deposited by a suitable technique, such as PVD. The n-type WF metal or the p-type WF metal may include various metal-based films as a stack for optimized device performance and processing compatibility. The blocking layer 1104-4 includes titanium nitride, tantalum nitride, or other suitable material, formed by a proper deposition technique such as ALD. In various embodiments, the filling metal layer 1104-5 includes aluminum, tungsten, copper or other suitable metal. The filling metal layer 1104-5 is deposited by a suitable technique, such as PVD or plating. In the furtherance of the embodiment, various films in the gate electrode 1104 are U-shaped and extend up to the top surface of the gate stack 1100, as illustrated in FIG. 11A.

Figure 11B:
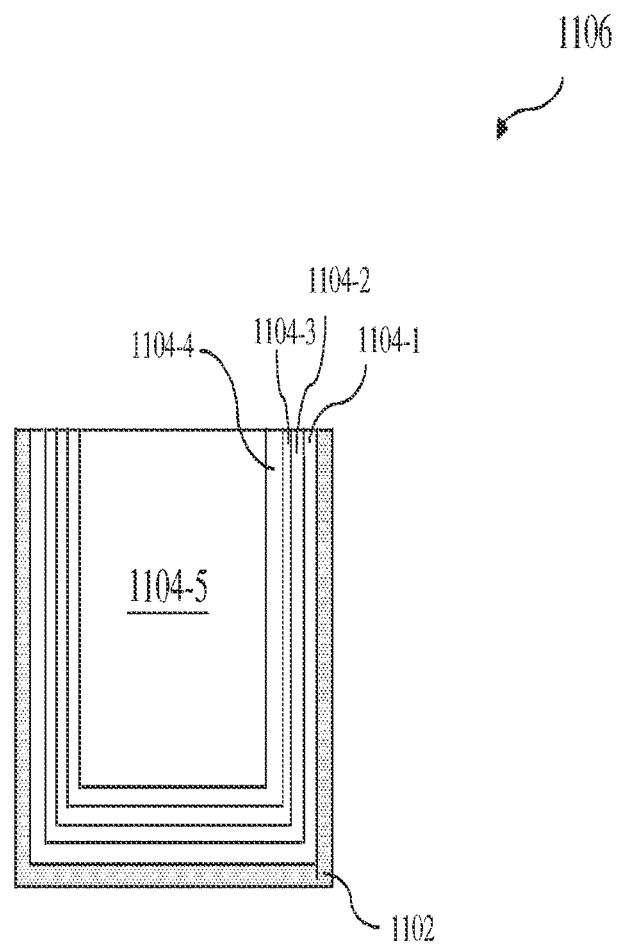

In alternative embodiment, a gate stack is formed by a high-k last process in which both the gate dielectric layer 1102 and the gate electrode 1104 are formed after the dummy gate is completely removed, such as the gate stack 1106 illustrated in FIG. 11B in a sectional view. In the present embodiment, the gate dielectric layer 1102 and various films in the gate electrode 1104 are U-shaped and extend to the top surface of the gate stack 1106.

Back to FIG. 4, the process 414 to form the gate-cut feature 504 or 702 may be implemented before the formation of the dummy gate, after the formation of the dummy gate, after the removal of the dummy gate but before the filling of the HKMG, or after the formation of the HKMG according to various embodiments.

FIG. 6 is a flowchart of a method 600 for fabricating the semiconductor structure 500 having fin-type transistors and deep isolation features inserted between the adjacent N-well and P-well, according to some embodiments. The method 600 is further described with reference to FIGS. 5A-5B. Some operations of the method 600 are similar to those of the method 400 and are not repeated here. The method 600 begins at the block 402 by providing a semiconductor substrate 512. The method 600 includes an operation 404 to form fin active regions (e.g., 206, 210 and 212); an operation to form deep isolation features, which are DTI features 502; and an operation 406 to form STI features 514; an operation 408 to form N-wells 202 and P-wells 204. Especially, each of the DTI features 502 is inserted between the adjacent N-well 202 and P-well 204. In the present example, the DTI features 502 have a top surface being coplanar with a surface of the STI features 514. The method 600 also includes an operation 602 to form dummy gate stacks on the fin active regions; and an operation 604 to form source/drain features 516, such as by etching to recess the source/drain regions and epitaxially growing a semiconductor material in the recesses. The method 600 also includes a procedure to replace the dummy gate stacks with metal gate stacks by double (or multiple) patterning. Especially, the method 600 includes an operation 606 to form an interlayer dielectric (ILD) layer by deposition and polishing; an operation 608 to remove the dummy gate stacks, resulting in gate trenches in the ILD layer; and operation 610 to form one or more gate-cut features 504 by deposition and patterning (where the patterning further includes lithography process and etching); an operation 612 to form metal gate stacks (e.g., 220 and 226) by a process that includes deposition and CMP; and an operation 416 to perform other fabrication process, such as forming an interconnection structure that includes contacts, via features and metal lines. As described above. The gate-cut features 504 are not necessarily aligned with the interfaces between adjacent N-well 202 and P-well 204; and are not necessarily deep since those only function to cut long gate stacks to short gate stacks.

Figure 9:
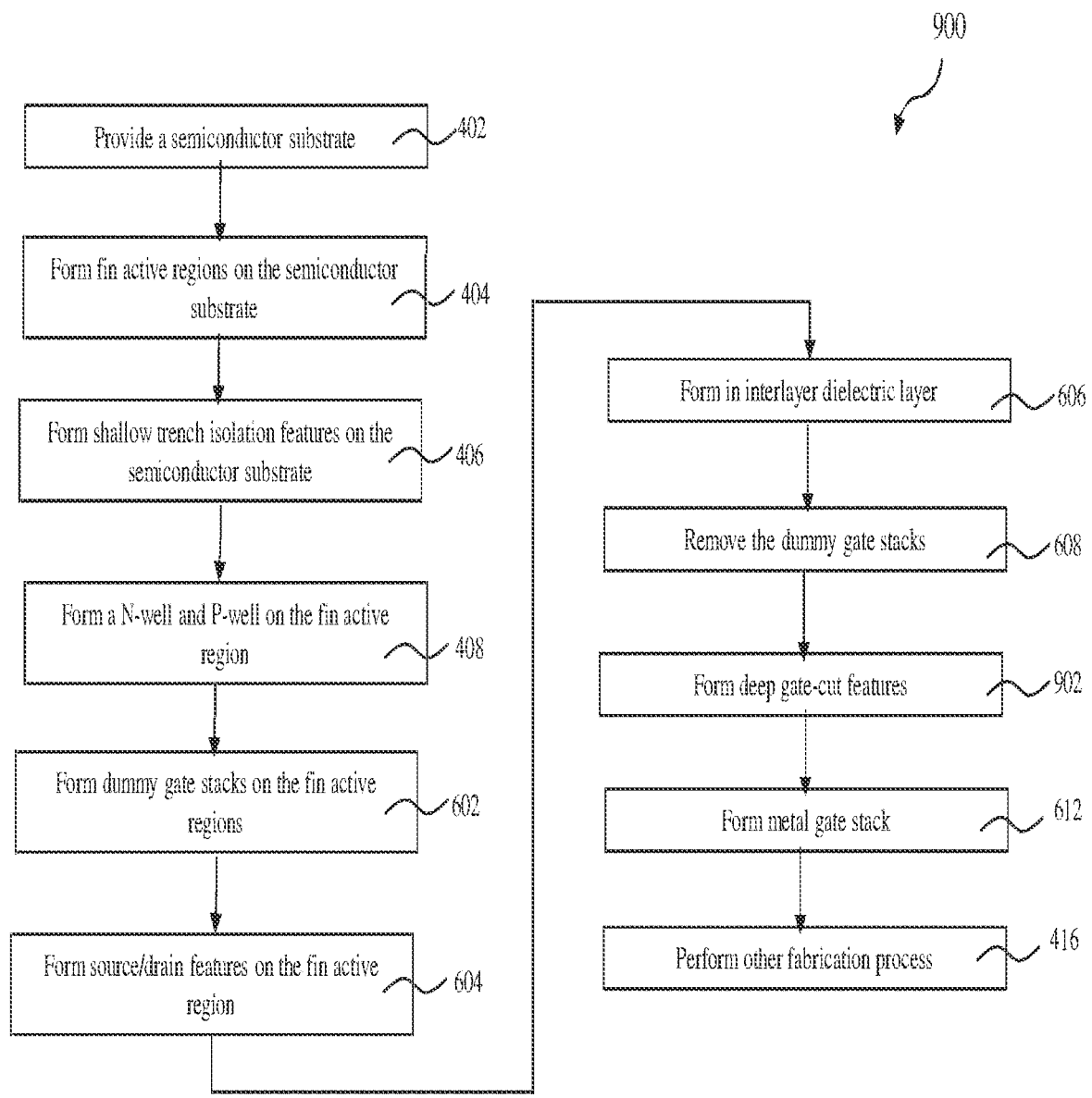
FIG. 9 is a flowchart of a method making a semiconductor structure constructed according to various aspects of the present disclosure in some embodiments.

FIG. 9 is a flowchart of a method 900 for fabricating a semiconductor structure having fin-type transistors and isolation features inserted between the adjacent N-well and P-well. The method 900 is described with reference to FIGS. 7, 8A, 8B and 9. The method 900 is one embodiments of the method 400 by aligning and extending the gate-cut features to serve as the isolation features for the doped wells. The method 900 begins with an operation 402 by providing a semiconductor substrate 512. The method 900 includes an operation 404 to form fin active regions on the semiconductor substrate 512; and an operation 406 by forming shallow trench isolation features 514 on the semiconductor substrate 512.

The method 900 also includes an operation 408 to form N-wells 202 and P-wells 204; an operation 602 to form dummy gate stacks on the fin active regions; and an operation 604 to form source/drain features 516. The method 900 also includes a procedure to replace the dummy gate stacks with metal gate stacks by double (or multiple) patterning. Especially, the method 900 includes an operation 606 to form an ILD layer, such as by deposition and CMP; an operation 608 to remove the dummy gate stacks, resulting in gate trenches in the ILD layer; and operation 610 to form one or more gate-cut features 702 by deposition and patterning; an operation 612 to form metal gate stacks (e.g., 220 and 226) by a process that includes deposition and CMP; and an operation 416 to perform other fabrication process, such as forming an interconnection structure that includes contacts, via features and metal lines. As described above. The gate-cut features 702 are aligned with the interfaces between adjacent N-well 202 and P-well 204; and are extended through the STI features 514 and the interface of the adjacent N-well 202 and P-well 204 since those gate-cut features also function to isolate the adjacent N-well and P-well in addition to cut long gate stacks to short gate stacks.

In some embodiments, the gate stacks include metal for gate electrode and high-k dielectric material for gate dielectric material. In some embodiments where the gate stacks include metal and high-k dielectric material, the gate stacks may be formed by a gate-last process or a high-k-last process In the above method, the dummy gates may be polysilicon gates. The formation of the polysilicon gates includes depositing the gate materials (including polysilicon in the present example); and patterning the gate materials by a lithographic process and etching. A gate hard mask layer may be formed on the gate material layer and is used as an etch mask during the formation of the gates. The gate hard mask layer may include any suitable material, such as a silicon oxide, a silicon nitride, a silicon carbide, a silicon oxynitride, other suitable materials, and/or combinations thereof. In one embodiment, the gate hard mask includes multiple films, such as silicon oxide and silicon nitride. In some embodiments, the patterning process to form the gates includes forming a patterned resist layer by lithography process; etching the hard mask layer using the patterned resist layer as an etch mask; and etching the gate materials to form the gates using the patterned hard mask layer as an etch mask.

One or more gate sidewall features (or gate spacers) are formed on the sidewalls of the gates. The gate spacers may be used to offset the subsequently formed source/drain features and may be used for designing or modifying the source/drain structure profile. The gate spacers may include any suitable dielectric material, such as a semiconductor oxide, a semiconductor nitride, a semiconductor carbide, a semiconductor oxynitride, other suitable dielectric materials, and/or combinations thereof. The gate spacers may have multiple films, such as two films (a silicon oxide film and a silicon nitride film) or three films (a silicon oxide film; a silicon nitride film; and a silicon oxide film). The formation of the gate spacers includes deposition and anisotropic etching, such as dry etching.

The operation 604 may include etching to recess source/drain regions; and epitaxially growing source/drain features with suitable semiconductor material, such as silicon, silicon germanium or another suitable semiconductor material. The source/drain features may be formed by selective epitaxy growth for strain effect with enhanced carrier mobility and device performance. The gates and gate spacer constrain the source/drain features to the source/drain regions. In some embodiments, the source/drain features are formed by one or more epitaxy or epitaxial (epi) processes, whereby Si features, SiGe features, SiC features, and/or other suitable features are grown in a crystalline state on the fin active regions. Alternatively, an etching process is applied to recess the source/drain regions before the epitaxy growth. Suitable epitaxy processes include CVD deposition techniques (e.g., vapor-phase epitaxy (VPE) and/or ultra-high vacuum CVD (UHV-CVD), molecular beam epitaxy, and/or other suitable processes. The source/drain features may be in-situ doped during the epitaxy process by introducing doping species including: p-type dopants, such as boron or $BF_2$; n-type dopants, such as phosphorus or arsenic; and/or other suitable dopants including combinations thereof. If the source/drain features are not in-situ doped, an implantation process (i.e., a junction implant process) is performed to introduce the corresponding dopant into the source/drain features. In an exemplary embodiment, the source/drain features in an nFET include SiC or Si doped with phosphorous, while those in a pFET include Ge or SiGe doped with boron. In some other embodiments, the raised source/drain features include more than one semiconductor material layers. For example, a silicon germanium layer is epitaxially grown on the substrate within the source/drain regions and a silicon layer is epitaxially grown on the silicon germanium layer. One or more annealing processes may be performed thereafter to activate the source/drain features. Suitable annealing processes include rapid thermal annealing (RTA), laser annealing processes, other suitable annealing technique or a combination thereof.

Figure 10:
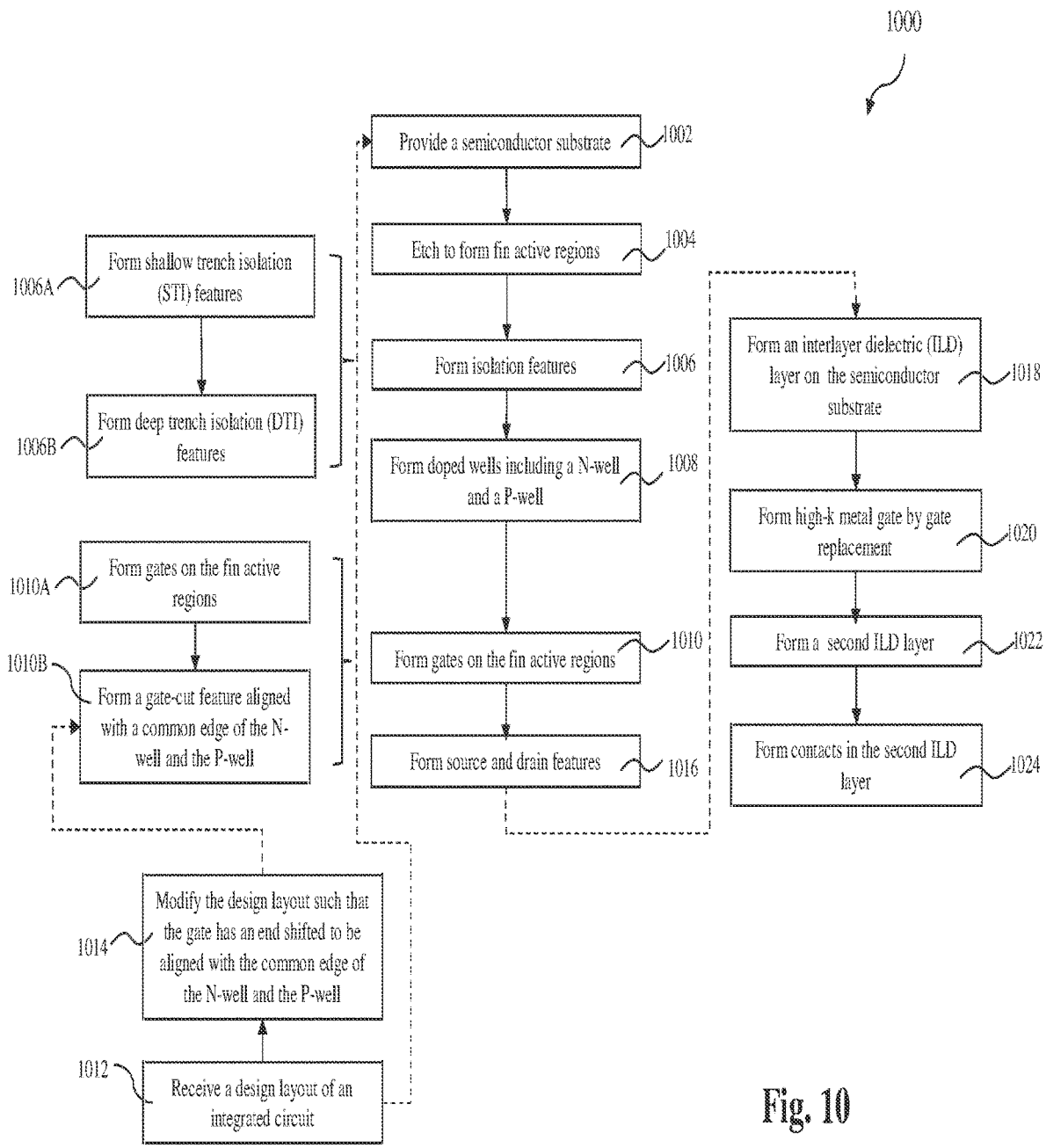
FIG. 10 is a flowchart of a method making a semiconductor structure constructed according to various aspects of the present disclosure in some embodiments.

FIG. 10 is a flowchart of a method 1000 for fabricating a semiconductor structure having fin-type transistors and isolation features inserted between the adjacent N-well and P-well. The method 1000 includes a block 1002 by providing a semiconductor substrate. The semiconductor substrate includes silicon. In some other embodiments, the substrate includes germanium, silicon germanium or other proper semiconductor materials. The substrate may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor substrate also includes various doped regions such as n-well and p-wells. In one embodiment, the semiconductor substrate includes an epitaxy (or epi) semiconductor layer. In another embodiment, the semiconductor substrate includes a buried dielectric material layer for isolation formed by a proper technology, such as a technology referred to as separation by implanted oxygen (SIMOX). In some embodiments, the substrate may be a semiconductor on insulator, such as silicon on insulator (SOI).

The method 1000 proceeds to an operation 1004 to form fin active regions and an operation 1006 to form isolation features on the semiconductor substrate. The fin active regions are formed by patterning the semiconductor substrate and the isolation features are formed by filling the trenches with dielectric material(s).

In some embodiments, the operation 1006 to form the isolation features includes 1006A to form STI features and 1006B to form DTI features aligned with the common edges of the N-well and P-well and inserted therebetween for isolation, as illustrated in FIG. 5B.

In some embodiments, the STI features are formed etching to form trenches, filling the trenches with dielectric material and polishing to remove the excessive dielectric material and planarize the top surface. When the isolation features include both STI features and DTI features, the formation includes first patterning to form shallow trenches; second patterning to form deep trenches; filling the trenches with dielectric material and polishing to remove the excessive dielectric material and planarize the top surface. One or more etching processes are performed on the semiconductor substrate through openings of soft mask or hard mask, which are formed by lithography patterning and etching.

The formation of the isolation features is further described below in accordance with some embodiments. In the present example, a hard mask is deposited on the substrate and is patterned by lithography process. The hard mask layers include a dielectric such as semiconductor oxide, semiconductor nitride, semiconductor oxynitride, and/or semiconductor carbide, and in an exemplary embodiment, the hard mask layer include a silicon oxide film and a silicon nitride film. The hard mask layer may be formed by thermal growth, atomic layer deposition (ALD), chemical vapor deposition (CVD), high density plasma CVD (HDP-CVD), other suitable deposition processes.

A photoresist layer (or resist) used to define the fin structure may be formed on the hard mask layer. An exemplary resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning. In one embodiment, the resist layer is patterned to leave the portions of the photoresist material disposed over the semiconductor structure by the lithography process. After patterning the resist, an etching process is performed on the SRAM device 200 to open the hard mask layer, thereby transferring the pattern from the resist layer to the hard mask layer. The remaining resist layer may be removed after the patterning the hard mask layer. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as mask-less photolithography, electron-beam writing, and ion-beam writing. The etching process to pattern the hard mask layer may include wet etching, dry etching or a combination thereof.

Then etching process may be followed to etch the portions of the substrate uncovered by the patterned hard mask layer. The patterned hard mask layer is used as an etch mask during the etching processes to pattern the substrate. The etching processes may include any suitable etching technique such as dry etching, wet etching, and/or other etching methods (e.g., reactive ion etching (RIE)). After the etching processes, the fin structure with fin active regions is defined on and extended from the substrate. One or more dielectric material is filled in the trenches to form the STI feature. Suitable fill dielectric materials include semiconductor oxides, semiconductor nitrides, semiconductor oxynitrides, fluorinated silica glass (FSG), low-K dielectric materials, and/or combinations thereof. In various exemplary embodiments, the dielectric material is deposited using a HDP-CVD process, a sub-atmospheric CVD (SACVD) process, a high-aspect ratio process (HARP), a flowable CVD (FCVD), and/or a spin-on process. The deposition of the dielectric material may be followed by a chemical mechanical polishing/planarization (CMP) process to remove the excessive dielectric material and planarize the top surface of the semiconductor structure.

The operation 1004 to form fin active regions may also include recessing the isolation features such that the fin active regions are extruded above from the isolation features. The recessing process employs one or more etching steps (such as dry etch, wet etch or a combination thereof) to selectively etch back the isolation features. For example, a wet etching process using hydrofluoric acid may be used to etch when the isolation features are silicon oxide.

Referring to block 1008 of FIG. 10, various doping processes may be applied to the semiconductor substrate to form N-wells and P-wells. Various doped wells may be formed in the semiconductor substrate by respective ion implantations, as described in the operation 408 of FIG. 4.

Referring to block 1010 of FIG. 10, gates are formed on the fin active regions. In some embodiments, the operation 1010 includes a double patterning process that further includes a process 1010A (a first lithography process and etching) to form long gates and then a process 1010B (a second process lithography process and etching) to form gate-cut features that cut the long gates into short gate gates. Especially, in the process 1010B, the gate-cut features are formed to be aligned with the common edge of the N-well and the P-well and formed to be deep to insert between the N-well and P-well for effective isolation, as illustrated in FIG. 8. In this case, the method 1000 further includes an operation 1012 by receiving a design layout of an integrated circuit (similar to the operation 902 of FIG. 9); and an operation 1014 by modifying the design layout of the integrated circuit such that a gate has an end shifted to be aligned with the common edge of the adjacent N-well and P-well, similar to the operation 904 of FIG. 9. Thus, various operations from 1002 to other fabrication operations are followed thereafter based on the modified design layout of the integrated circuit. Particularly, the process 1010B to form the gate-cut feature is implemented according to the modified design layout.

The method 1000 also includes an operation 1016 to form source and drain features similar to the operation 912 of FIG. 9. The operation 1016 includes etching to recess source/drain regions and epitaxially growing one or more semiconductor material on the recessed source/drain regions to form source and drain features with strain effect for enhanced mobility and device speed.

The method 1000 proceeds to an operation 1018 to form an interlayer dielectric (ILD) layer on the semiconductor substrate. The ILD layer includes silicon oxide, low-k dielectric material, other suitable dielectric material or a combination thereof. The operation 1018 include deposition and CMP according some examples.

In some embodiments, the gate formed during the operation 1010 is a polysilicon gate and is replaced by gate of metal and high-k dielectric material (also referred to as metal gate) by an operation 1020. The operation 1020 includes etching to remove polysilicon gates or otherwise formed dummy gates, resulting in trenches in the ILD layer; depositing gate material to fill in the trenches; and CMP to remove excessive gate materials from the ILD layer. In alternative embodiments, the operation to form a gate-cut feature is applied to the metal gate and is implemented after the operation 1020. In this case, a long metal gate replaces the long polysilicon gate, and then the gate-cut feature cuts through the long metal gate.

The method 1000 also includes an operation 1022 to form a second ILD layer and an operation 1024 to form various contacts in the second ILD layer. The method may also include other fabrication process to form the integrated circuit, such as operations to form interconnection structure to couple various features (doped wells, gates, and source and drain features) into a functional circuit, such as a SRAM array or a logic circuit or a logic circuit with embedded SRAM array.

The present disclosure provides a method and an integrated circuit structure made by the method to provide effective isolation between adjacent doped wells such that the latch-up effect is suppressed. The integrated circuit structure includes a STI feature landing on adjacent N-well and P-well and a deep isolation feature inserted into the common edge of the N-well and P-well to effectively isolate the corresponding N-well and P-well. The deep isolation has a width less than the width of the STI feature and is distanced away from fin active regions. The deep isolation feature is a deep trench isolation feature or a modified gate-cut feature. The integrated circuit structure includes a SRAM device or a SRAM array or other suitable circuit such as a logic circuit or other circuit having an inverter.

By implementing the disclosed method and the structure, the latch-up effect is suppressed. As noted above, the latch-up effect is caused by current leakage and the resistances of the doped wells. The deep isolation feature can effectively isolate the adjacent N-well and P-well to suppress latch-up effect by eliminating or reducing the current leakage. Additionally, the doping concentration of the doped wells can be increased to reduce the resistance of the wells without the concern of the current leakage, which further suppress the latch-up effect.

Thus, the present disclosure provides a semiconductor structure in accordance with some embodiments. The semiconductor structure includes a semiconductor substrate having a n-type doped well (N-well) and a p-type doped well (P-well) disposed side by side; a first fin active region extruded from the N-well of the semiconductor substrate; a second fin active region extruded from the P-well of the semiconductor substrate; a first isolation feature formed on the N-well and the P-well and laterally contacting the first and second fin active regions, the first isolation feature having a first width; and a second isolation feature inserted between the N-well and the P-well, the second isolation feature having a second width less than the first width.

The present disclosure provides a method forming a semiconductor structure in accordance with some other embodiments. The method includes forming a first isolation feature on a semiconductor substrate; forming a n-type doped well (N-well) and a p-type doped well (P-well) with a common edge underlying the first isolation feature; and forming a second isolation feature aligned with the common edge and inserted between the N-well and the P-well.

The present disclosure provides a method forming an integrated circuit structure in accordance with some embodiments. The method includes receiving a design layout of the integrated circuit having an inverter that includes a n-type field effect transistor and a p-type field effect transistor sharing a gate; modifying the design layout such that the gate of the inverter has an end aligned to a common edge of a n-type doped well (N-well) and a p-type doped well (P-well); and fabricating the integrated circuit according to the modified design layout.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming an integrated circuit, the method comprising:
    forming a n-type doped well (N-well) and a p-type doped well (P-well) disposed side by side on a semiconductor substrate;
    form a first fin active region extruded from the N-well and a second fin active region extruded from the P-well;
    forming a first isolation feature inserted between and vertically extending through the N-well and the P-well, wherein the first isolation feature is free of contact with the first fin and the second fin; and
    forming a second isolation feature over the N-well and the P-well and laterally contacting the first and the second fin active regions.

2. The method of claim 1, wherein the P-well is a first P-well disposed along a first sidewall of the N-well, the method further comprises:
    forming a second P-well disposed along a second sidewall of the N-well;
    forming a third isolation feature (502) between the second P-well and the N-well;
    forming a gate cut feature over the second isolation feature, wherein the gate cut feature is vertically aligned with the third isolation feature; and
    forming a first gate and a second gate disposed on a first side and a second side of the gate cut feature.

3. The method of claim 2, wherein the gate cut feature has a bottom surface below a top surface of the second isolation feature, and wherein the gate cut feature has a top surface coplanar with top surfaces of the first gate and the second gate.

4. The method of claim 2, wherein the gate cut feature extends through the second isolation feature and contacts the third isolation feature.

5. The method of claim 4, wherein a top surface of the gate cut feature is above top surfaces of the first gate and the second gate.

6. The method of claim 2, wherein the first isolation feature is vertically shifted away from the gate cut feature.

7. The method of claim 1, wherein the first isolation feature is narrower than the second isolation feature.

8. A method of forming an integrated circuit, the method comprising:
    forming a shallow trench isolation feature on a semiconductor substrate;
    forming a deep trench isolation feature cutting into the shallow trench isolation feature and the semiconductor substrate; and
    forming a n-type doped well (N-well) and a p-type doped well (P-well) in the semiconductor substrate, wherein the N-well and the P-well are disposed over the a opposite sidewalls of the deep trench isolation feature;
    forming a first metal gate and a second metal gate over the shallow trench isolation feature, wherein the first metal gate and the second metal gate are disposed over opposite side walls of the deep trench isolation feature.

9. The method of claim 8, wherein a top surface of the deep trench isolation feature is above top surfaces of the first metal gate and the second metal gate, and wherein a bottom surface of the deep trench isolation feature is below bottom surfaces of the N-well and the P-well.

10. The method of claim 9, wherein a height of the deep trench isolation feature above the top surfaces of the first metal gate and the second metal gate is about 0.05 to about 0.2 of a sum of thicknesses of the N-well, the shallow trench isolation feature, and the first metal gate.

11. The method of claim 9, wherein a height of the deep trench isolation feature below the bottom surfaces of the N-well and the P-well is about 0.05 to about 0.1 of a sum of thicknesses of the N-well, the shallow trench isolation feature, and the first metal gate.

12. The method of claim 8, wherein the P-well is a first P-well disposed on a first side of the N-well, wherein the deep trench isolation feature is a first deep trench isolation feature, and wherein the method further comprises:
    forming a second P-well on a second side of the N-well; and
    forming a second deep trench isolation feature between the second P-well and the N-well, wherein the second deep trench isolation feature has a top surface coplanar with top surfaces of the N-well and the second P-well.

13. The method of claim 8, further comprising a first fin disposed over the N-well and a second fin disposed over the P-well, wherein the deep trench isolation feature physically contacts the N-well, the P-well, the shallow trench isolation feature, the first metal gate, and the second metal gate, while free of contacts with the first fin and the second fin.

14. A semiconductor structure, comprising:
a semiconductor substrate;
a deep trench isolation feature extending into the semiconductor substrate;
a n-type doped well (N-well) disposed in the semiconductor substrate and along a first sidewall of the deep trench isolation feature;
a p-type doped well (P-well) disposed in the semiconductor substrate adjacent to the N-well and along a second sidewall of the deep trench isolation feature; and
a shallow trench isolation feature disposed over the N-well and the P-well and along the first sidewall and the second sidewall.

15. The semiconductor structure of claim 14, wherein the P-well is a first P-well disposed on a first side of the N-well, wherein the deep trench isolation feature is a first deep trench isolation feature, wherein the semiconductor structure further comprises:
a second P-well disposed on a second side of the N-well;
a second deep trench isolation feature disposed between the second p-well and the N-well, wherein the second deep trench isolation feature cuts through the shallow trench isolation feature;
a gate disposed over the shallow trench isolation feature; and
a gate cut feature disposed at an end of the gate, wherein gate cut feature vertically aligns with the second deep trench isolation feature.

16. The semiconductor structure of claim 15, wherein the gate cut feature extends into the shallow trench isolation feature.

17. The semiconductor structure of claim 16, wherein a portion of the gate cut feature extended to the shallow trench isolation feature has a length about 0.2 to about 0.5 of a length of the gate cut feature.

18. The semiconductor structure of claim 16, wherein the gate cut feature extends through the shallow trench isolation feature and contacts the second deep trench isolation feature.

19. The semiconductor structure of claim 14, further comprising a first fin over the N-well and a second fin over the P-well, wherein the shallow trench isolation feature physically contacts the first fin and the second fin, and wherein the deep trench isolation feature is free of contact with the first fin and the second fin.

20. The semiconductor structure of claim 14, wherein a portion of the deep trench isolation feature extended into the semiconductor substrate has a height about 0.2 to about 0.5 of a length of the deep trench isolation feature.

* * * * *